United States Patent [19]

Ohmori et al.

[11] 4,024,081
[45] May 17, 1977

[54] FERROELECTRIC CERAMIC COMPOSITIONS

[75] Inventors: Yasuo Ohmori; Mitsuo Sakakura; Hajime Miyajima, all of Saitama, Japan

[73] Assignee: Toko Incorporated, Tokyo, Japan

[22] Filed: Sept. 26, 1974

[21] Appl. No.: 509,600

Related U.S. Application Data

[63] Continuation-in-part of Ser. No. 305,076, Nov. 9, 1972, abandoned.

[30] Foreign Application Priority Data

Nov. 10, 1971  Japan .............................. 46-89672

[52] U.S. Cl. ............................................. 252/62.9
[51] Int. Cl.$^2$ ................... C04B 35/46; C04B 35/48
[58] Field of Search .................................. 252/62.9

[56] References Cited

UNITED STATES PATENTS

| | | | |
|---|---|---|---|
| 3,403,103 | 9/1968 | Ouchi et al. ...................... | 252/62.9 |
| 3,463,732 | 8/1969 | Banno et al. ...................... | 252/62.9 |
| 3,637,506 | 1/1972 | Tanizake et al. .................. | 252/62.9 |

OTHER PUBLICATIONS

Tanaka et al., "Chemical Abstracts," vol. 64, 1966, 11997b.

*Primary Examiner*—Jack Cooper
*Attorney, Agent, or Firm*—Charles E. Pfund

[57] ABSTRACT

Ferroelectric ceramic compositions consisting essentially of quaternary solid solutions of $Pb(Fe\frac{1}{2}.Nb\frac{1}{2})O_3$—$Pb(Zn\frac{1}{3}.Nb\frac{2}{3})O_3$—$PbZrO_3$—$PbTiO_3$, the components of which are within a defined range of relative proportions, have substantially higher insulation resistance characteristics and substantially higher electromechanical coupling coefficient characteristics than prior art compositions. Additionally, the components within a more restricted range of relative proportions have the additional characteristic of a higher Poisson's ratio than prior art compositions.

1 Claim, 8 Drawing Figures

FERROELECTRIC CERAMIC COMPOSITIONS

This application is a continuation-in-part of our copending application Ser. No. 305,076 filed Nov. 9, 1972, now abandoned.

BACKGROUND OF THE INVENTION

This invention relates to ferroelectric ceramic compositions consisting of solid solutions of $Pb(Fe_{1/2}.NB_{1/2})O_3$- $Pb(Zn_{1/3}.Nb_{2/3})O_3$- $PbTiO_3$- $PbZrO_3$ which are contained in a prescribed ratio range.

Ferroelectric ceramics utilized to construct ceramic filters, ultrasonic wave delay line elements, piezoelectric ignition elements and piezoelectric vibrating elements are required to be polarized readily when a DC voltage is applied and to have optimum electrical characteristics, as for example, high insulating resistances (IR), high electromechanical coupling coefficients (Kp), high dielectric constants ($\epsilon$), and high Poisson's ratios ($\sigma$).

Heretobefore, ceramic compositions of the binary system, typically compositions of the $PbTiO_3$-$PbZrO_3$ type, and ternary system, typically compositions of the $Pb(Mg_{1/3}.Nb_{2/3})O_3$-$PbTiO_3$-$PbZrO_3$ type are generally used to prepare these ferroelectric ceramics. Generally, however, these compositions are difficult to fire and their range of firing temperature is narrow. Furthermore, it is difficult to obtain fired products of homogeneous composition.

For example, compositions of the $PbTiO_3$-$PbZrO_3$ type are difficult to fire because lead oxide, one of the constituents, readily vaporizes during the firing step so that the resulting ceramics lack homogeneity and denseness and their dielectric and piezoelectric properties greatly depend upon the Zr:Ti ratio.

In addition to these drawbacks, compositions of the $Pb(Fe_{1/2}.Nb_{1/2})$-$PbTiO_3$-$PbZrO_3$ type have low insulation resistance and are difficult to polarize. Furthermore, with the compositions of the $Pb(Zn_{1/3}.Nb_{2/3})O_3$-$PbTiO_3$-$PbZrO_3$ type the range of the compositions manifesting satisfactory electrical characteristics is extremely narrow. Also, in many applications of the ferroelectric ceramic compositions they are being used widely as a resonator of an energy-trapped type in electric wave filters for 1 to 10 MHz frequencies. In such applications, however, ferroelectric ceramic compositions having a Poisson's ratio of less than one-third essentially prevent the necessary energy trapping.

In the prior art it has been difficult to produce ceramic compositions having a Poisson's ratio of one-third, and it has been almost impossible to obtain ceramic compositions with a ratio of more than one-third. For example, an article in IRE, 1960 No. 2, pages 220 to 221, reports the highest Poisson's ratio for a ceramic composition as 0.328. Furthermore, the frequency variation in relation to the temperature variation (the temperature characteristics of the frequency) of an electric wave filter utilizing the prior art ceramic compositions has normally been about 100 ppm and in no instance better than 50 ppm with some superior materials.

Thus, none of these prior art compositions is suitable for obtaining ceramics with excellent electrical characteristics.

SUMMARY OF THE INVENTION

It is an object of this invention to provide improved ferroelectric ceramic compositions capable of eliminating various defects of the prior art compositions pointed out hereinabove.

In other words, it is the principal object of this invention to provide novel ferroelectric ceramic compositions which have wide ranges of firing temperature and can be utilized in the preparation of ceramics on a commercial scale which have high densities, high insulation resistances, high electromechanical coupling coefficients and large dielectric constants.

Another object of this invention is to provide novel ferroelectric ceramic compositions possessing improved characteristics for use in energy-trapped type filters, the Poisson's ratios of which are more than one-third.

Still another object of this invention is to provide compositions possessing excellent characteristics for electric wave filters together with better temperature characteristics at fixed frequencies.

According to this invention there are provided fired ferroelectric ceramic compositions consisting essentially of quaternary solid solutions of $Pb(Fe_{1/2}.Nb_{1/2})O_3$-$Pb(Zn_{1/3}.Nb_{2/3})O_3$-$PbZrO_3$-$PbTiO_3$ in the relative proportions by mol % within the volume defined by the envelope enclosing the polygon area of the ternary diagrams of FIGS. 1–8 as sections in numerical order, the volume having the surface defined by a plurality of polygonal plane surfaces having apices corresponding to the numerals assigned thereto in FIGS. 1–8 as follows:

polygonal plane surfaces (1,5,9,10,8,4), (1,5,13,25), (25,39,5), (5,9,39), (39,48,9), (9,48,10), (10,49,48), (49,43,10,8), (8,43,14,4), (14,4,1), (1,14,13), (13,25,60,72), (25,39,72,86), (39,48,86), (48,49,86,90), (49,43,90), (90,71,43), (14,71,62,43), (14,13,60,62), (60,72,100,112), (72,86,112), (112,125,86), (86,125,123), (123,86,90), (123,111,90), (90,71.111), (71,62,111,102), (62,60,102,100), (100,112,133,140), (112,140,146), (112,125,146), (125,146,123), (123,146,149), (123,111,149), (111,149,135), (111,102,135), (102,100,135,133), (133,140,158,165), (140,146,165, 170), (146,149,170), (149,170,168), (149,135,168), (135,168,157), (135,133,157), (133,157,158), (158,165,177,183), (165,170,183), (183,184,170), (170,168,184), (168,184,181), (168,157,181), (157,181,177), (157,158,177) and (177,183,184,181)

where the numerals correspond to the compositional values designed in mol % in accordance with the following table of relative proportions:

| | $Pb(Zn_{1/3}.Nb_{2/3})O_3$ | $Pb(Fe_{1/2}.Nb_{1/2})O_3$ | $PbZrO_3$ | $PbTiO_3$ |
|---|---|---|---|---|
| 1 | 1 | 1 | 69.3 | 28.7 |
| 5 | 1 | 1 | 49.5 | 48.5 |
| 9 | 1 | 19.8 | 39.6 | 39.6 |
| 10 | 1 | 29.7 | 39.6 | 29.7 |
| 8 | 1 | 29.7 | 49.5 | 19.8 |
| 4 | 1 | 19.8 | 59.4 | 19.8 |
| 13 | 10 | 1 | 70 | 19 |
| 25 | 10 | 1 | 39 | 50 |
| 39 | 10 | 20 | 20 | 50 |
| 48 | 10 | 50 | 10 | 30 |
| 49 | 10 | 60 | 10 | 20 |
| 43 | 10 | 60 | 20 | 10 |
| 14 | 10 | 10 | 70 | 10 |
| 60 | 20 | 1 | 60 | 19 |
| 72 | 20 | 1 | 29 | 50 |
| 86 | 20 | 20 | 10 | 50 |
| 90 | 20 | 60 | 10 | 10 |
| 71 | 20 | 40 | 40 | 0 |
| 62 | 20 | 20 | 60 | 0 |

-continued

| | Pb(Zn⅓.Nb⅔)O₃ | Pb(Fe½.Nb½)O₃ | PbZrO₃ | PbTiO₃ |
|---|---|---|---|---|
| 100 | 30 | 1 | 50 | 19 |
| 112 | 30 | 1 | 19 | 50 |
| 125 | 30 | 10 | 0 | 60 |
| 123 | 30 | 50 | 10 | 10 |
| 111 | 30 | 40 | 30 | 0 |
| 102 | 30 | 20 | 50 | 0 |
| 133 | 40 | 1 | 40 | 19 |
| 140 | 40 | 1 | 19 | 40 |
| 146 | 40 | 10 | 10 | 40 |
| 149 | 40 | 40 | 10 | 10 |
| 135 | 40 | 20 | 40 | 0 |
| 158 | 50 | 1 | 30 | 19 |
| 165 | 50 | 1 | 9 | 40 |
| 170 | 50 | 10 | 0 | 40 |
| 168 | 50 | 30 | 10 | 10 |
| 157 | 50 | 10 | 40 | 0 |
| 177 | 60 | 10 | 20 | 10 |
| 183 | 60 | 10 | 0 | 30 |
| 184 | 60 | 20 | 0 | 20 |
| 181 | 60 | 20 | 10 | 10 |

BRIEF DESCRIPTION OF THE DRAWINGS

In the accompanying drawings.

DESCRIPTION OF THE PREFERRED EMBODIMENTS

Figure 1:
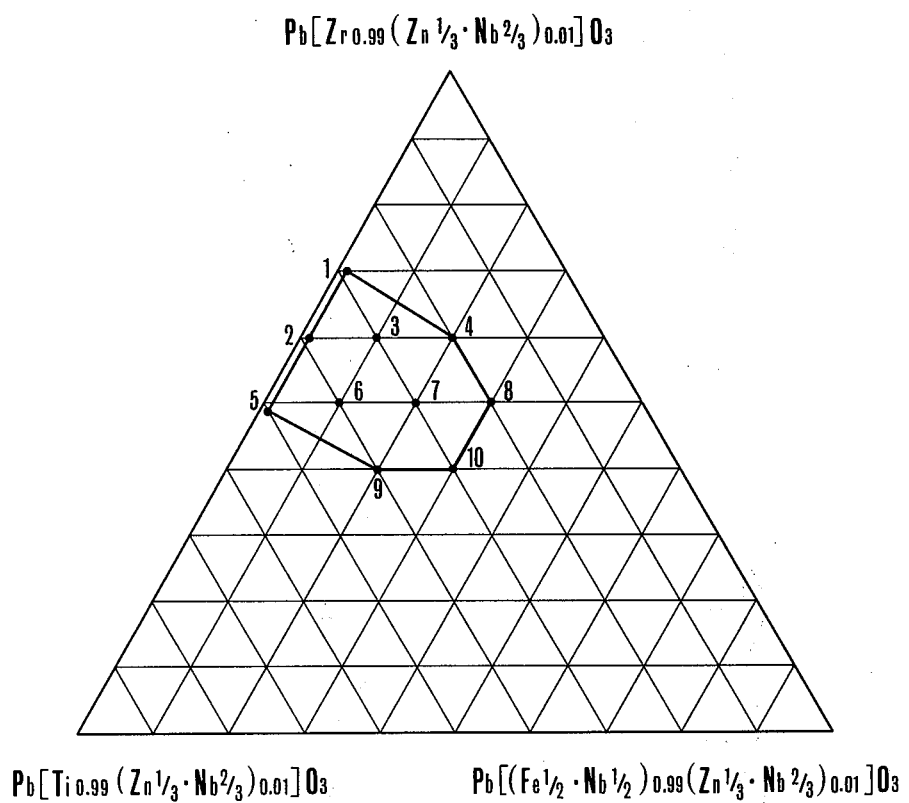
FIGS. 1–8 show phase diagrams of novel ferroelectric ceramic compositions in sections which respectively correspond to 1 mol %, 10 mol %, 20 mol %, 30 mol %, 40 mol %, 50 mol %, 60 mol % and 70 mol % of Pb(Zn⅓.Nb⅔)O₃ as one of the components of the compositions.

As the starting materials, respective oxides Pb(Zn⅓.Nb⅔)O₃, Pb(Fe½.Nb½)O₃, PbZrO₃ and PbTiO₃ were weighed to form compositions of samples 1 to 192 referred to in the following Table 1. Each sample was mixed and pulverized for 15 hours in a wet-type pot mill lined with rubber and containing agate balls to obtain a homogeneous ceramic composition. The resulting composition was dried and calcined for 2 hours at a temperature of 800° to 900° C. Then the calcined composition was pulverized with a wet-type ball mill for 15 hours, and the pulverized compositon was dried.

1%, by weight based on the weight of the mixture, of an aqueous solution of polyvinyl alcohol was incorporated in each composition and the mixture was thoroughly kneaded with a mixer, suitably dried and pulverized. Particles having a grain size of 60 to 150 mesh were selected by means of a sieve. The resulting particles were put in a metal mold and molded with an oil pressure molding machine under a pressure of 1.5 tons/cm² to obtain a circular disc having a diameter of 22 mm and a thickness of 2 mm. The disc thus obtained was heated gradually to a temperature of 700° C in an air circulated electric furnace to remove polyvinyl alcohol and then fired in an alumina crucible for 1 hour. The firing temperature was varied from 1170° to 1360° C depending upon the composition. The temperature was raised at a rate of 300° C/hr. After maintaining the firing temperature at a desired value for a prescribed period, the heating element of the crucible was deenergized and the disc was cooled in the crucible. The resulting disc was lapped to a thickness of 0.6 mm and silver electrodes were printed and baked to the opposite surfaces of each disc.

Each disc was immersed in a silicon oil and polarized for 15 minutes at 140° C under a DC voltage of 3 KV/mm. After 24 hours, various electrical characteristics of the disc were measured to obtain the results shown in Table 1. The temperature characteristics of the frequency in Table 1 were calculated by the following equation:

$$\text{Temperature characteristics} = \frac{fr\,(-20°\,C) - fr\,(80°\,C)}{100 \times fr\,(25°\,C)}$$

TABLE 1

| sample number | Composition mol % | | | | Firing temp. °C | Kp (%) | ε | Qm | IR (× 10⁴MΩ) | Curie temp. °C | σ | Temp. Characteristics of frequency (ppm) |
|---|---|---|---|---|---|---|---|---|---|---|---|---|
| | A | B | C | D | | | | | | | | |
| 1 | 1 | 1 | 69.3 | 28.7 | 1320 | 22.5 | 421 | 284 | 1.2 | | | |
| 2 | 1 | 1 | 59.4 | 38.6 | 1310 | 31.3 | 469 | 233 | 3.1 | | | |
| 3 | 1 | 9.9 | 59.4 | 29.7 | 1300 | 30.4 | 534 | 318 | 5.0 | | 0.309 | |
| 4 | 1 | 19.8 | 59.4 | 19.8 | 1280 | 25.5 | 530 | 235 | 1.2 | 296 | | |
| 5 | 1 | 1 | 49.5 | 48.5 | 1310 | 24.7 | 436 | 211 | 1.3 | | | |
| 6 | 1 | 9.9 | 49.5 | 39.6 | 1300 | 48.9 | 817 | 248 | 2.0 | 329 | | |
| 7 | 1 | 19.8 | 49.5 | 29.7 | 1290 | 26.4 | 553 | 218 | 1.0 | | | |
| 8 | 1 | 29.7 | 49.5 | 19.8 | 1300 | 24.8 | 545 | 186 | 0.6 | | | |
| 9 | 1 | 19.8 | 39.6 | 39.6 | 1290 | 24.7 | 581 | 192 | 0.7 | | | |
| 10 | 1 | 29.7 | 39.6 | 29.7 | 1290 | 28.4 | 692 | 127 | 0.7 | 305 | | |
| *11 | 10 | 1 | 80 | 9 | 1310 | 13.8 | 282 | 123 | 0.8 | | | |
| *12 | 10 | 10 | 80 | 0 | 1320 | 11.5 | 276 | 134 | 1.2 | | | |
| 13 | 10 | 1 | 70 | 19 | 1320 | 21.2 | 386 | 173 | 1.8 | | | |
| 14 | 10 | 10 | 70 | 10 | 1360 | 21.9 | 537 | 215 | 1.3 | | 0.280 | |
| *15 | 10 | 20 | 70 | 0 | 1300 | 12.8 | 358 | 151 | 1.6 | | | |
| 16 | 10 | 1 | 60 | 29 | 1300 | 33.3 | 510 | 138 | 0.8 | | | |
| 17 | 10 | 10 | 60 | 20 | 1360 | 28.9 | 534 | 176 | 0.8 | | 0.311 | |
| 18 | 10 | 20 | 60 | 10 | 1360 | 23.1 | 534 | 214 | 1.2 | | 0.306 | |
| *19 | 10 | 30 | 60 | 0 | 1300 | 14.4 | 631 | 202 | 1.8 | | | |
| 20 | 10 | 1 | 50 | 39 | 1290 | 47.7 | 853 | 97 | 3.8 | | | |
| 21 | 10 | 10 | 50 | 30 | 1360 | 36.9 | 600 | 114 | 0.6 | 287 | 0.335 | |
| 22 | 10 | 20 | 50 | 20 | 1280 | 36.3 | 597 | 148 | 0.7 | | 0.317 | |
| 23 | 10 | 30 | 50 | 10 | 1280 | 28.7 | 622 | 184 | 0.7 | | 0.317 | |
| *24 | 10 | 40 | 50 | 0 | 1280 | 15.7 | 674 | 234 | 1.4 | | | |
| 25 | 10 | 1 | 39 | 50 | 1290 | 29.5 | 703 | 111 | 1.6 | | | |
| 26 | 10 | 10 | 40 | 40 | 1300 | 43.3 | 1195 | 120 | 1.8 | | 0.382 | |
| 27 | 10 | 20 | 40 | 30 | 1300 | 49.8 | 762 | 97 | 0.8 | | 0.335 | |
| 28 | 10 | 30 | 40 | 20 | 1300 | 40.2 | 658 | 133 | 0.6 | | 0.333 | |
| 29 | 10 | 40 | 40 | 10 | 1260 | 32.1 | 651 | 174 | 0.4 | | 0.314 | |
| *30 | 10 | 50 | 40 | 0 | 1260 | 16.4 | 670 | 331 | 0.5 | | | |
| *31 | 10 | 1 | 29 | 60 | 1280 | 11.8 | 419 | 83 | 2.4 | | | |
| 32 | 10 | 10 | 30 | 50 | 1300 | 24.6 | 570 | 58 | 2.4 | | 0.341 | |
| 33 | 10 | 20 | 30 | 40 | 1300 | 30.3 | 819 | 117 | 2.4 | | 0.338 | |
| 34 | 10 | 30 | 30 | 30 | 1280 | 41.5 | 1546 | 111 | 1.6 | 274 | 0.384 | |

TABLE 1-continued

| sample number | Composition mol % A | B | C | D | Firing temp. °C | Kp (%) | ε | Qm | IR (× 10⁴MΩ) | Curie temp. °C | σ | Temp. Characteristics of frequency (ppm) |
|---|---|---|---|---|---|---|---|---|---|---|---|---|
| 35 | 10 | 40 | 30 | 20 | 1260 | 43.5 | 759 | 119 | 0.5 | | 0.337 | |
| 36 | 10 | 50 | 30 | 10 | 1300 | 33.1 | 745 | 173 | 1.0 | | 0.340 | |
| *37 | 10 | 60 | 30 | 0 | 1300 | | | | 0.03 | | | |
| *38 | 10 | 10 | 20 | 60 | | | | | | | | |
| 39 | 10 | 20 | 20 | 50 | 1280 | 21.2 | 484 | 47 | 1.8 | | | |
| 40 | 10 | 30 | 20 | 40 | 1260 | 24.5 | 636 | 107 | 2.5 | | 0.342 | |
| 41 | 10 | 40 | 20 | 30 | 1300 | 31.8 | 906 | 124 | 0.6 | | 0.349 | −58 |
| 42 | 10 | 50 | 20 | 20 | 1260 | 37.5 | 1878 | 115 | 1.3 | | 0.380 | |
| 43 | 10 | 60 | 20 | 10 | 1260 | 32.8 | 872 | 156 | 1.0 | | 0.337 | |
| *44 | 10 | 70 | 20 | 0 | 1260 | | | | less than 0.001 | | | |
| *45 | 10 | 20 | 10 | 60 | | | | | | | | |
| *46 | 10 | 30 | 10 | 50 | 1260 | | | | less than 0.001 | | | |
| *47 | 10 | 40 | 10 | 40 | 1260 | | | | 0.002 | | | |
| 48 | 10 | 50 | 10 | 30 | 1260 | 27.2 | 741 | 82 | 2.0 | | 0.339 | |
| 49 | 10 | 60 | 10 | 20 | 1240 | 32.6 | 1235 | 238 | 1.3 | | 0.350 | +75 |
| *50 | 10 | 70 | 10 | 10 | 1260 | | | | less than 0.001 | | | |
| *51 | 10 | 80 | 10 | 0 | 1240 | | | | less than 0.001 | | | |
| *52 | 10 | 30 | 0 | 60 | 1260 | | | | less than 0.001 | | | |
| *53 | 10 | 40 | 0 | 50 | 1260 | | | | less than 0.001 | | | |
| *54 | 10 | 50 | 0 | 40 | 1240 | | | | less than 0.001 | | | |
| *55 | 10 | 60 | 0 | 30 | 1240 | | | | less than 0.001 | | | |
| *56 | 10 | 70 | 0 | 20 | 1240 | | | | less than 0.001 | | | |
| *57 | 10 | 80 | 0 | 10 | 1220 | | | | less than 0.001 | | | |
| *58 | 20 | 1 | 70 | 9 | 1220 | 19.2 | 632 | 180 | 1.8 | | | |
| *59 | 20 | 10 | 70 | 0 | | | | | | | | |
| 60 | 20 | 1 | 60 | 19 | 1300 | 26.2 | 497 | 165 | 1.1 | | | |
| 61 | 20 | 10 | 60 | 10 | 1320 | 27.0 | 695 | 188 | 0.9 | | 0.302 | |
| 62 | 20 | 20 | 60 | 0 | 1260 | 20.8 | 669 | 221 | 0.6 | | | |
| 63 | 20 | 1 | 50 | 29 | 1290 | 40.5 | 685 | 137 | 1.0 | | | |
| 64 | 20 | 10 | 50 | 20 | 1300 | 36.1 | 714 | 146 | 0.8 | | 0.312 | |
| 65 | 20 | 20 | 50 | 10 | 1300 | 31.6 | 733 | 160 | 0.8 | | 0.316 | |
| 66 | 20 | 30 | 50 | 0 | 1280 | 20.7 | 718 | 252 | 2.0 | | | |
| 67 | 20 | 1 | 40 | 39 | 1300 | 55.3 | 1070 | 84 | 1.4 | | | |
| 68 | 20 | 10 | 40 | 30 | 1300 | 50.0 | 796 | 92 | 1.2 | | 0.334 | |
| 69 | 20 | 20 | 40 | 20 | 1280 | 43.1 | 774 | 123 | 1.0 | | 0.316 | |
| 70 | 20 | 30 | 40 | 10 | 1280 | 33.7 | 730 | 160 | 0.6 | | 0.315 | |
| 71 | 20 | 40 | 40 | 0 | 1260 | 21.1 | 771 | 324 | 0.6 | | | |
| 72 | 20 | 1 | 29 | 50 | 1290 | 28.5 | 699 | 121 | 1.8 | | | |
| 73 | 20 | 10 | 30 | 40 | 1280 | 40.8 | 1023 | 136 | 2.4 | 304 | 0.358 | |
| 74 | 20 | 20 | 30 | 30 | 1300 | 45.5 | 1608 | 110 | 2.0 | | 0.378 | |
| 75 | 20 | 30 | 30 | 20 | 1260 | 47.4 | 892 | 106 | 0.5 | 228 | 0.335 | |
| 76 | 20 | 40 | 30 | 10 | 1260 | 36.7 | 820 | 150 | 0.5 | | 0.324 | |
| *77 | 20 | 50 | 30 | 0 | 1280 | | | | 0.03 | | | |
| *78 | 20 | 1 | 19 | 60 | 1300 | 13.6 | 380 | 253 | 3.0 | | | |
| 79 | 20 | 10 | 20 | 50 | 1300 | 26.2 | 563 | 244 | 3.1 | | 0.340 | |
| 80 | 20 | 20 | 20 | 40 | 1260 | 27.0 | 753 | 213 | 2.7 | | 0.348 | |
| 81 | 20 | 30 | 20 | 30 | 1280 | 38.1 | 1175 | 134 | 2.4 | | 0.363 | −58 |
| 82 | 20 | 40 | 20 | 20 | 1260 | 52.4 | 2144 | 107 | 1.4 | | 0.390 | |
| 83 | 20 | 50 | 20 | 10 | 1240 | 41.4 | 1026 | 122 | 0.5 | | 0.334 | |
| *84 | 20 | 60 | 20 | 0 | 1260 | | | | 0.005 | | | |
| *85 | 20 | 10 | 10 | 60 | | | | | | | | |
| 86 | 20 | 20 | 10 | 50 | 1280 | 24.3 | 602 | 258 | 3.0 | | 0.326 | |
| 87 | 20 | 30 | 10 | 40 | 1260 | 38.5 | 628 | 265 | 2.6 | | 0.336 | |
| 88 | 20 | 40 | 10 | 30 | 1240 | 27.7 | 907 | 191 | 1.7 | | 0.337 | |
| 89 | 20 | 50 | 10 | 20 | 1260 | 37.1 | 1507 | 128 | 1.8 | | 0.365 | −6 |
| 90 | 20 | 60 | 10 | 10 | 1240 | 42.8 | 1410 | 192 | 1.1 | | 0.367 | |
| *91 | 20 | 70 | 10 | 0 | 1280 | | | | 0.02 | | | |
| *92 | 20 | 20 | 0 | 60 | 1260 | | | | less than 0.001 | | | |
| *93 | 20 | 30 | 0 | 50 | 1260 | | | | less than 0.001 | | | |
| *94 | 20 | 40 | 0 | 40 | 1240 | | | | less than 0.001 | | | |
| *95 | 20 | 50 | 0 | 30 | 1240 | | | | less than 0.001 | | | |
| *96 | 20 | 60 | 0 | 20 | 1220 | | | | less than 0.001 | | | |
| *97 | 20 | 70 | 0 | 10 | 1220 | | | | less than 0.001 | | | |
| *98 | 30 | 1 | 60 | 10 | 1300 | 18.9 | 507 | 155 | 1.1 | | | |
| *99 | 30 | 10 | 60 | 0 | 1300 | 17.5 | 785 | 261 | 1.6 | | | |
| 100 | 30 | 1 | 50 | 19 | 1280 | 30.3 | 600 | 137 | 1.5 | | | |
| 101 | 30 | 10 | 50 | 10 | 1280 | 28.8 | 865 | 177 | 1.3 | | 0.314 | |
| 102 | 30 | 20 | 50 | 0 | 1260 | 22.3 | 824 | 230 | 0.6 | | | |
| 103 | 30 | 1 | 40 | 29 | 1280 | 47.3 | 882 | 109 | 1.7 | | | |
| 104 | 30 | 10 | 40 | 20 | 1300 | 40.6 | 917 | 115 | 1.0 | | 0.334 | |
| 105 | 30 | 20 | 40 | 10 | 1260 | 33.0 | 888 | 153 | 1.4 | | 0.318 | |
| 106 | 30 | 30 | 40 | 0 | 1240 | 22.2 | 923 | 180 | 0.8 | | | |

TABLE 1-continued

| sample number | Composition mol % | | | | Firing temp. °C | Kp (%) | ε | Qm | IR (× 10⁴MΩ) | Curie temp. °C | σ | Temp. Characteristics of frequency (ppm) |
|---|---|---|---|---|---|---|---|---|---|---|---|---|
| | A | B | C | D | | | | | | | | |
| 107 | 30 | 1 | 30 | 39 | 1290 | 42.1 | 1333 | 103 | 1.5 | | 0.377 | −10 |
| 108 | 30 | 10 | 30 | 30 | 1280 | 61.4 | 1855 | 81 | 0.9 | | 0.337 | |
| 109 | 30 | 20 | 30 | 20 | 1260 | 44.8 | 958 | 110 | 0.8 | | 0.333 | |
| 110 | 30 | 30 | 30 | 10 | 1240 | 33.5 | 932 | 141 | 1.2 | | | |
| 111 | 30 | 40 | 30 | 0 | 1240 | 20.5 | 906 | 249 | 0.6 | | | |
| 112 | 30 | 1 | 19 | 50 | 1270 | 23.7 | 727 | 152 | 2.5 | | | |
| 113 | 30 | 10 | 20 | 40 | 1260 | 33.9 | 856 | 180 | 2.9 | | 0.340 | |
| 114 | 30 | 20 | 20 | 30 | 1260 | 36.7 | 1319 | 141 | 2.5 | | 0.371 | |
| 115 | 30 | 30 | 20 | 20 | 1240 | 58.0 | 2271 | 89 | 2.6 | 220 | 0.384 | |
| 116 | 30 | 40 | 20 | 10 | 1240 | 42.4 | 1039 | 120 | 0.7 | | 0.340 | |
| *117 | 30 | 50 | 20 | 0 | 1260 | | | | 0.005 | | | |
| *118 | 30 | 1 | 9 | 60 | 1260 | 12.5 | 466 | 258 | 2.8 | | | |
| 119 | 30 | 10 | 10 | 50 | 1260 | 20.7 | 516 | 331 | 2.4 | | 0.306 | |
| 120 | 30 | 20 | 10 | 40 | 1260 | 23.0 | 677 | 284 | 2.2 | | 0.320 | |
| 121 | 30 | 30 | 10 | 30 | 1240 | 31.9 | 951 | 124 | 3.2 | | 0.335 | |
| 122 | 30 | 40 | 10 | 20 | 1260 | 40.2 | 1586 | 140 | 1.8 | | 0.371 | +32 |
| 123 | 30 | 50 | 10 | 10 | 1240 | 33.5 | 1575 | 121 | 0.7 | | 0.370 | |
| *124 | 30 | 60 | 10 | 0 | 1260 | | | | 0.009 | | | |
| 125 | 30 | 10 | 0 | 60 | 1200 | 24.0 | 798 | 243 | 0.8 | | | |
| *126 | 30 | 20 | 0 | 50 | 1190 | 19.8 | 901 | 248 | 0.6 | | | |
| *127 | 30 | 30 | 0 | 40 | 1240 | | | | less than 0.001 | | | |
| *128 | 30 | 40 | 0 | 30 | 1240 | | | | less than 0.001 | | | |
| *129 | 30 | 50 | 0 | 20 | 1240 | | | | less than 0.001 | | | |
| *130 | 30 | 60 | 0 | 10 | 1220 | | | | less than 0.001 | | | |
| *131 | 40 | 1 | 50 | 9 | | | | | | | | |
| *132 | 40 | 10 | 50 | 0 | 1240 | 18.6 | 865 | 221 | 1.1 | | | |
| 133 | 40 | 1 | 40 | 19 | 1260 | 39.6 | 689 | 183 | 1.2 | 246 | | |
| 134 | 40 | 10 | 40 | 10 | 1280 | 24.3 | 919 | 188 | 2.1 | | 0.328 | |
| 135 | 40 | 20 | 40 | 0 | 1240 | 22.0 | 876 | 189 | 0.5 | | | |
| 136 | 40 | 1 | 30 | 29 | 1270 | 55.5 | 1483 | 97 | 1.3 | | | |
| 137 | 40 | 10 | 30 | 20 | 1280 | 40.0 | 1068 | 109 | 1.2 | | 0.342 | |
| 138 | 40 | 20 | 30 | 10 | 1240 | 29.4 | 1025 | 152 | 1.4 | | 0.321 | |
| *139 | 40 | 30 | 30 | 0 | 1240 | 19.4 | 979 | 197 | 0.6 | | | |
| 140 | 40 | 1 | 19 | 40 | 1260 | 31.3 | 1251 | 128 | 2.3 | | | |
| 141 | 40 | 10 | 20 | 30 | 1260 | 42.1 | 1458 | 113 | 2.5 | | 0.381 | |
| 142 | 40 | 20 | 20 | 20 | 1240 | 55.5 | 1863 | 98 | 1.4 | 222 | 0.348 | |
| 143 | 40 | 30 | 20 | 10 | 1200 | 28.6 | 1181 | 136 | 1.1 | | 0.338 | |
| *144 | 40 | 40 | 20 | 0 | 140 | | | | 0.03 | | | |
| *145 | 40 | 1 | 9 | 50 | 1240 | 18.8 | 588 | 177 | 2.4 | | | |
| 146 | 40 | 10 | 10 | 40 | 1240 | 26.4 | 718 | 217 | 2.7 | | 0.326 | |
| 147 | 40 | 20 | 10 | 30 | 1200 | 29.8 | 1074 | 174 | 2.2 | | 0.331 | |
| 148 | 40 | 30 | 10 | 20 | 1200 | 42.2 | 1780 | 128 | 1.8 | | 0.358 | +20 |
| 149 | 40 | 40 | 10 | 10 | 1240 | 32.3 | 1557 | 124 | 1.1 | | 0.328 | |
| *150 | 40 | 50 | 10 | 0 | 1240 | | | | 0.003 | | | |
| *151 | 40 | 10 | 0 | 50 | 1260 | 13.6 | 487 | 291 | 0.6 | | | |
| *152 | 40 | 20 | 0 | 40 | 1220 | | | | 0.01 | | | |
| *153 | 40 | 30 | 0 | 30 | 1220 | | | | less than 0.001 | | | |
| *154 | 40 | 40 | 0 | 20 | 1220 | | | | less than 0.001 | | | |
| *155 | 40 | 50 | 0 | 10 | 1220 | | | | less than 0.001 | | | |
| *156 | 50 | 1 | 40 | 9 | | | | | | | | |
| 157 | 50 | 10 | 40 | 0 | 1270 | 23.6 | 666 | 128 | 2.3 | | | |
| 158 | 50 | 1 | 30 | 19 | 1220 | 39.2 | 853 | 125 | 2.4 | | | |
| 159 | 50 | 10 | 30 | 10 | 1200 | 23.2 | 909 | 179 | 2.5 | | | |
| *160 | 50 | 20 | 30 | 0 | 1230 | 18.1 | 807 | 281 | 2.0 | | | |
| 161 | 50 | 1 | 20 | 29 | 1200 | 47.8 | 1548 | 115 | 2.1 | | | |
| 162 | 50 | 10 | 20 | 20 | 1200 | 51.8 | 1422 | 99 | 2.4 | 225 | 0.330 | |
| 163 | 50 | 20 | 20 | 10 | 1220 | 28.3 | 1175 | 145 | 1.5 | | | |
| *164 | 50 | 30 | 20 | 0 | 1230 | 19.5 | 1019 | 249 | 3.0 | | | |
| 165 | 50 | 1 | 9 | 40 | 1200 | 26.8 | 977 | 160 | 3.0 | | | |
| 166 | 50 | 10 | 10 | 30 | 1180 | 31.7 | 1070 | 163 | 2.7 | | | |
| 167 | 50 | 20 | 10 | 20 | 1200 | 36.4 | 1909 | 129 | 1.1 | | | +20 |
| 168 | 50 | 30 | 10 | 10 | 1200 | 29.9 | 1457 | 112 | 1.3 | | | |
| *169 | 50 | 40 | 10 | 0 | 1200 | | | | 0.01 | | | |
| 170 | 50 | 10 | 0 | 40 | 1220 | 21.6 | 614 | 294 | 0.6 | | | |
| *171 | 50 | 20 | 0 | 30 | 1190 | 19.1 | 901 | 248 | 4.4 | | | |
| *172 | 50 | 30 | 0 | 20 | 1240 | | | | less than 0.001 | | | |
| *173 | 50 | 40 | 0 | 10 | 1220 | | | | less than 0.001 | | | |
| *174 | 60 | 1 | 30 | 9 | | | | | | | | |
| *175 | 60 | 10 | 30 | 0 | 1200 | | | | 0.003 | | | |
| *176 | 60 | 1 | 20 | 19 | | | | | | | | |
| 177 | 60 | 10 | 20 | 10 | 1240 | 55.5 | 1863 | 99 | 1.4 | | | |
| *178 | 60 | 20 | 20 | 0 | 1180 | | | | 0.002 | | | |
| *179 | 60 | 1 | 9 | 30 | | | | | | | | |
| 180 | 60 | 10 | 10 | 20 | 1180 | 37.9 | 1797 | 111 | 2.5 | | | |
| 181 | 60 | 20 | 10 | 10 | 1220 | 24.5 | 1271 | 149 | 1.6 | | | |
| 182 | 60 | 30 | 10 | 0 | 1220 | 21.9 | 1232 | 25 | 0.4 | 140 | | |
| 183 | 60 | 10 | 0 | 30 | 1230 | 20.8 | 785 | 207 | 3.0 | 205 | | |
| 184 | 60 | 20 | 0 | 20 | 1190 | 23.8 | 1332 | 175 | 2.8 | | | |
| *185 | 60 | 30 | 0 | 10 | 1200 | | | | 0.006 | | | |

TABLE 1-continued

| sample number | Composition mol % | | | | Firing temp. °C | Kp (%) | ε | Qm | IR (× 10⁴MΩ) | Curie temp. °C | σ | Temp. Characteristics of frequency (ppm) |
| --- | --- | --- | --- | --- | --- | --- | --- | --- | --- | --- | --- | --- |
| | A | B | C | D | | | | | | | | |
| *186 | 70 | 0 | 20 | 10 | | | | | | | | |
| *187 | 70 | 10 | 20 | 0 | 1200 | | | | less than 0.001 | | | |
| *188 | 70 | 0 | 10 | 20 | | | | | | | | |
| *189 | 70 | 10 | 10 | 10 | | | | | | | | |
| *190 | 70 | 20 | 10 | 0 | 1200 | | | | 0.002 | | | |
| *191 | 70 | 10 | 0 | 20 | 1170 | 27.8 | 1888 | 150 | 0.2 | 165 | | |
| *192 | 70 | 20 | 0 | 10 | 1190 | 24.4 | 1187 | 177 | 0.2 | 152 | | |

Remarks:
A Pb(Zn⅓ . Nb⅔)O₃
B Pb(Fe½ . Nb½)O₃
C PbZrO₃
D PbTiO₃
Kp Electro-mechanical coupling coefficient
ε Dielectric constant
IR Insulating resistance
σ Poisson's ratio
MΩ 10⁶Ω

As can be noted from Table 1, samples not marked with a symbol * are the compositions included in the scope of this invention. Ceramics prepared by these compositions showed an excellent electro-mechanical coefficient (Kp), a large dielectric constant (ε) and a high insulation resistance (IR).

Also, as seen from Table 1, according to the novel ceramic compositions of the present invention, high Poisson's ratios of more than 0.333 were obtained over a wide range. An extremely high value of 0.390 was obtained with Sample No. 82.

Further, as for the temperature characteristics of the frequency, excellent characteristics such as —(minus) 6 ppm with Sample No. 89 and —(minus) 10 ppm with Sample No. 108 were obtained. It should be understood that, even with resonators containing quartz which are considered to possess excellent temperature characteristics of the frequency, the best obtainable value is in the order to ppm at most.

In Table 1 those marked with a symbol *, that is Sample Nos. 11, 12, 15, 19, 24, 30, 31, 37, 38, 44–47, 50–59, 77, 78, 84, 85, 91–99, 117, 118, 124, 126–132, 139, 144, 145, 150–156, 160, 164, 169, 171–176, 178, 179, 182, 185–192, are not included in the scope of this invention.

More particularly, Samples 38, 45, 59, 85, 131, 156, 174, 176, 179, 186, 188 and 189 cannot form fired ceramics. The insulation resistances of the ceramics prepared from Samples 37, 44, 46, 47, 50–57, 77, 84, 91–97, 117, 124, 127–130, 144, 150, 152–155, 169, 172, 173, 175, 178, 185, 187 and 190 are lower than 0.2 × 10⁴ MΩ and the IR-temperature characteristics of these samples were also poor. The electro-mechanical coupling coefficients (Kp) of the ceramics prepared from Samples 11, 12, 15, 19, 24, 30, 31, 58, 78, 98, 99, 118, 132, 139, 145, 151, 160, 164, and 171 were less than 20% which are too low for practical use. Further, ceramics prepared from Samples 182, 191 and 192 have relatively low Curie temperatures not suitable for practical use.

In this invention, instead of using PbO and Fe₂O₃, it is also possible to use peroxides or hydroxides of these metals such as Pb₃O₄, Fe(OH)₃ which are convertible to oxides by heat decomposition. It is also possible to use a mixture of an oxide, and a peroxide or a hydrogen. It should also be understood that the zirconium oxide utilized in this invention may contain a small quantity of hafnium since hafnium is not separable from zirconium oxide for industrial use.

As above described, the novel ceramic compositions of this invention consisting essentially of quaternary solid solution of Pb(Fe½.Nb½)O₃-Pb(Zn⅓.Nb⅔)O₃-PbZrO₃-PbTiO₃ and containing the constituents at a definite ratio can be fired at lower temperatures than well known ceramic compositions in a wider range of firing temperatures. Moreover, the quantity of evaporation of Pb during the firing step is small so that it is possible to produce dense and homogeneous ferroelectric ceramics. Since the resulting ceramics have high insulation resistance and high diamagnetic field property they can be readily polarized, for example in about 15 minutes under a voltage of 3 KV/mm. Moreover, the ceramics containing the novel compositions have dielectric constant ε varying over a wide range of 500 to 2000, and have high values of electro-mechanical coupling coefficient (Kp). Consequently, the novel compositions can provide ferroelectric ceramics having desired characteristics for any application.

In order to produce a ceramic filter of an energy-trapped type, the Poisson's ratio of the ceramic compositions needs to be more than one-third and Poisson's ratios of more than one-third over a wide range are obtainable by the present invention.

Thus, the ceramic compositions of the present invention, particularly the compositions in the volume defined by a plurality of polygonal surfaces having apecies corresponding to the following sample numbers, when used as ceramic filters of an energy-trapped type, have little spurious oscillation (unwanted oscillation) and have excellent filter characteristics.

Figure 2:
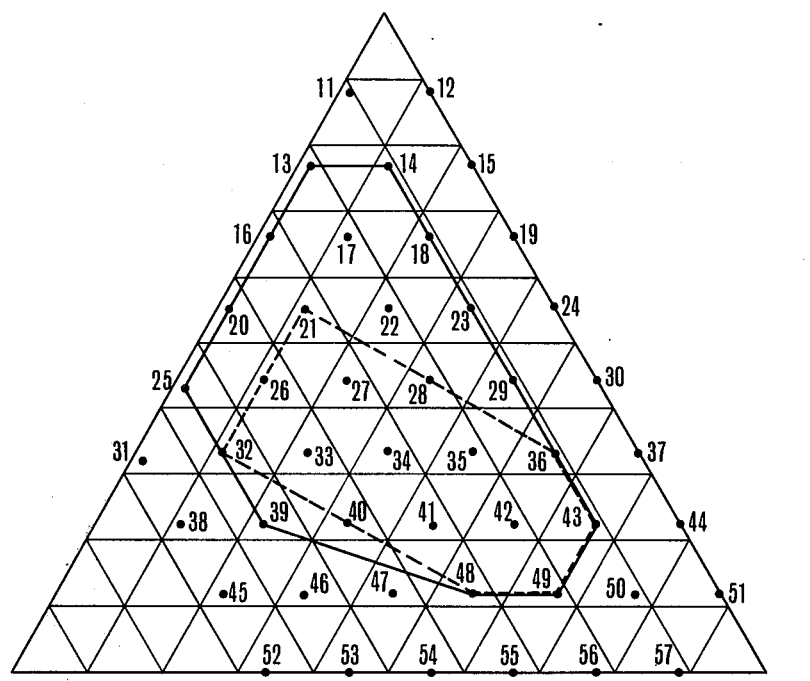
Figure 3:
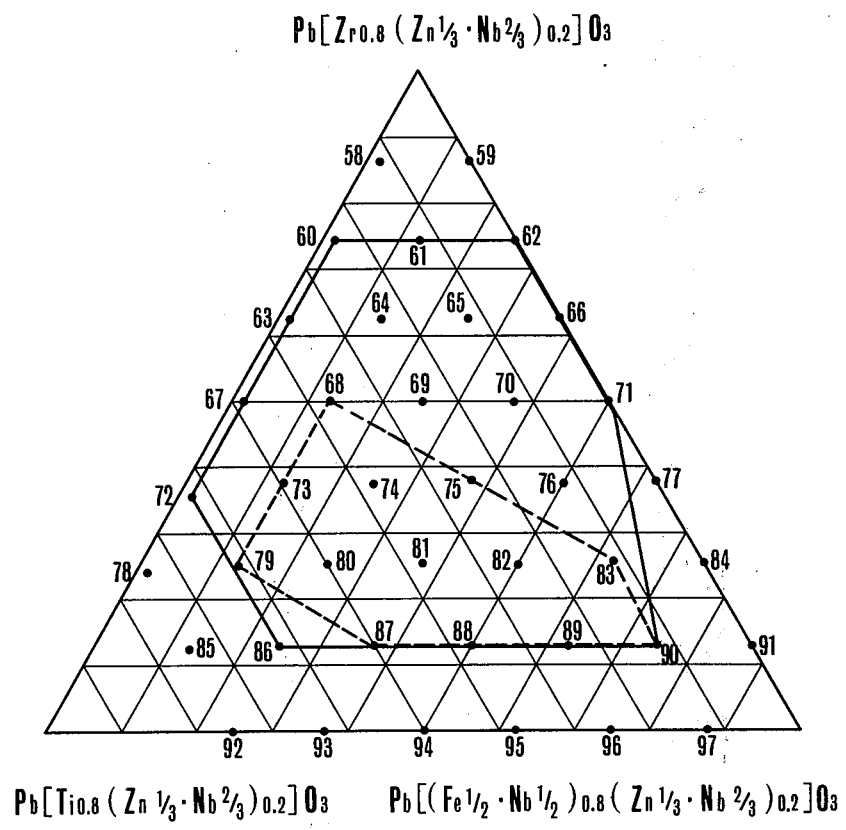
Figure 4:
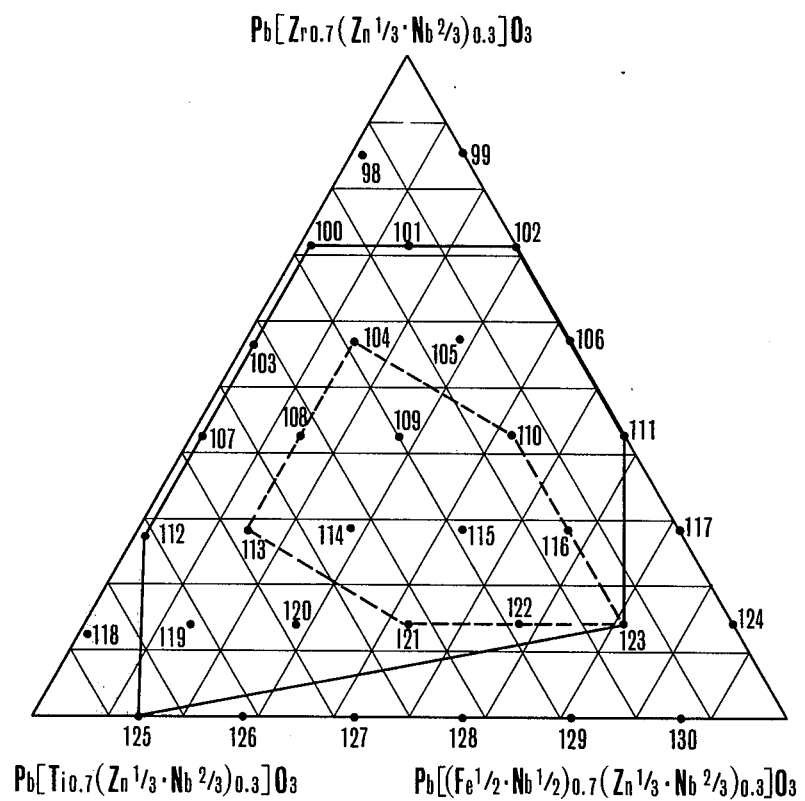
Figure 5:
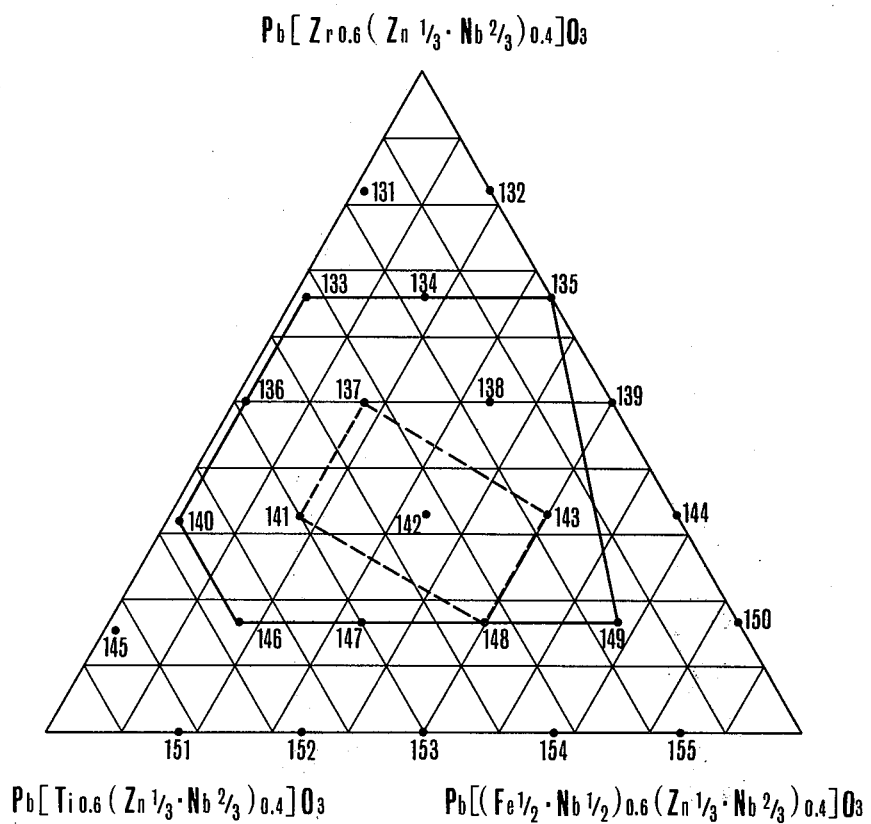
Figure 6:
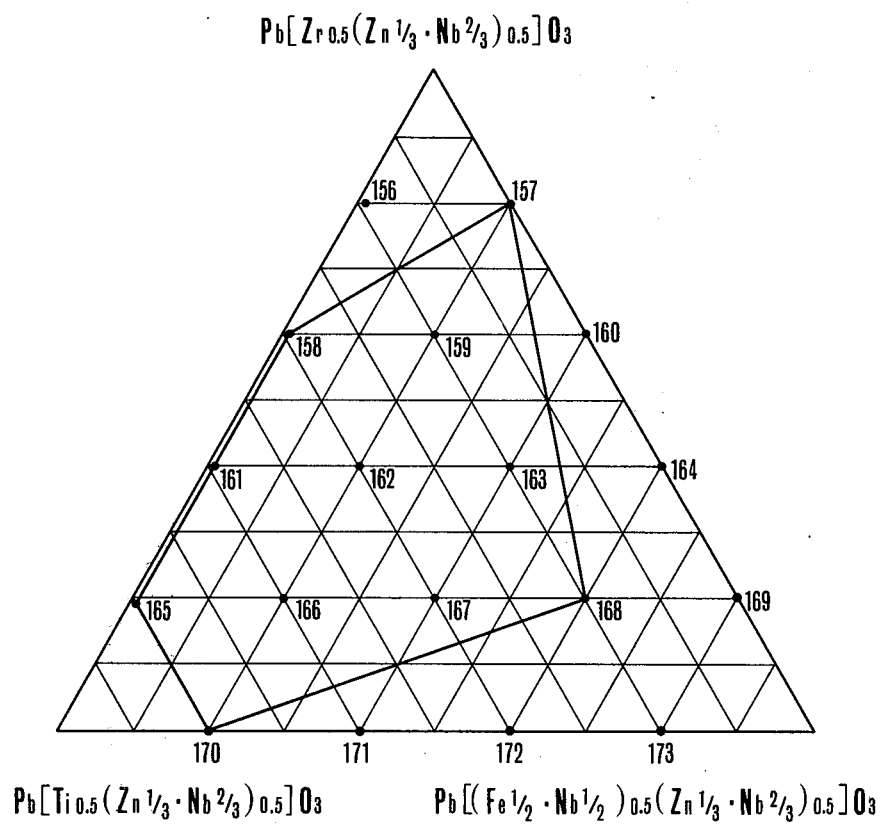
Figure 7:
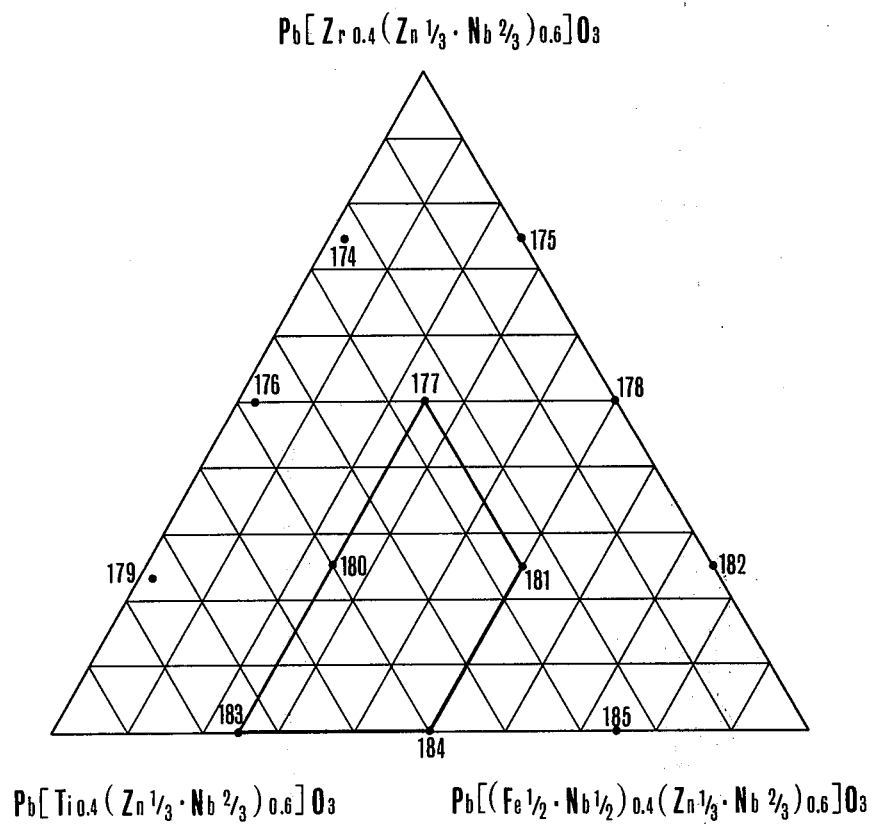
Figure 8:
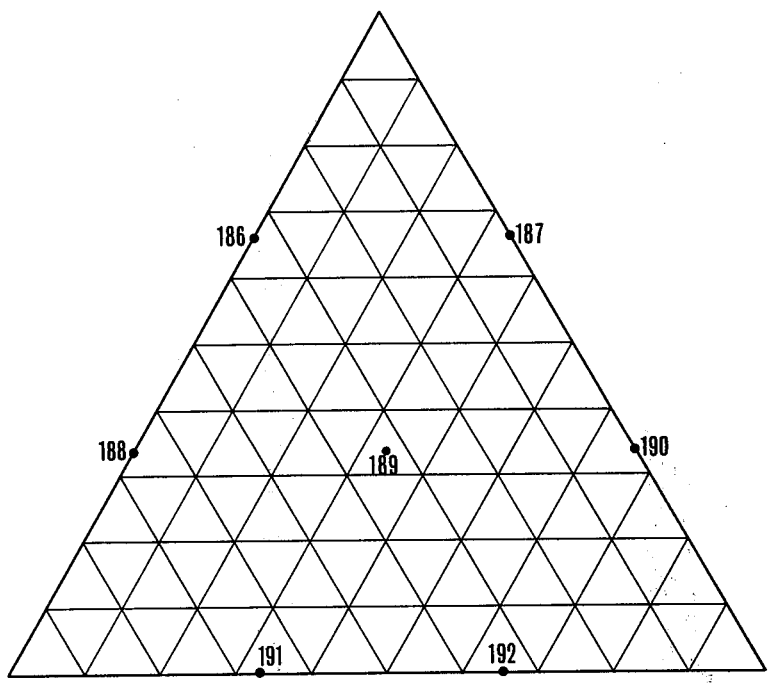

Referring to FIGS. 1–8, the plurality of polygonal surfaces defining those compositions having a Poisson's ratio greater than one-third are designated by: (32,48,49,43,36,21), (21,32,79,68), (32,48,87,79), (48,90,87), (48,49,90), (49,43,90), (43,36,83,90), (36,21,68,83), (68,79,113,104), (79,87,121,113), (87,90,123,121), (90,83,110,123), (83,68,104,110), (104,113,141,137), (113,121,148,141), (121,123,148), (123,143,148), (123,110,143), (110,104,137,143), and (137,141,148,143). The polygonal surfaces are drawn by connecting points in each of the parentheses. The polygonal surfaces three-dimensionally constitute a volume, and some of them are on the sectional planes as illustrated in FIGS. 2–5 in dotted lines.

Also, because the ceramic compositions of the present invention have an excellent advantage in the temperature characteristics of the frequency, an electric wave filter utilizing these materials can be very accurate with little variation in the frequency due to temperature.

Furthermore, since the ceramic compositions of the present invention form in entirety a solid solution, combinations of different characteristics according to needs can easily be obtained.

In FIGS. 1–8 of the accompanying drawings which show phase diagrams of novel ferroelectric compositions respectively containing 1 mol %, 10 mol %, 20 mol %, 30 mol %, 40 mol %, 50 mol %, 60 mol % and 70 mol % of the constituent $Pb(Zn_{1/3}.Nb_{2/3})O_3$, reference numerals 1–184 show compositions 1 to 184 shown in Table 1. FIGS. 1–8 are drawn by sectioning a trigonal pyramid a predetermined mol % of $Pb(Zn_{1/3}.Nb_{2/3})O_3$ in parallel with the bottom surfaces of the trigonal pyramid, which trigonal pyramid has a triangular bottom surface with apices of $PbZrO_3$, $PbTiO_3$ and $Pb(Fe_{1/2}.Nb_{1/2})O_3$ and the remaining apex of $Pb(Zn_{1/3}.Nb_{2/3})O_3$. The manner of sectioning is simply for the convenience of explaining the invention, and it is understandable that the section can be indicated by any of the mol quantities of $PbZrO_3$, $PbTiO_3$ or $Pb(Fe_{1/2}.Nb_{1/2})O_3$ instead of $Pb(Zn_{1/3}.Nb_{2/3})O_3$.

We claim:

1. Fired ferroelectric ceramic compositions consisting essentially of quaternary solid solutions of $Pb(Fe_{1/2}.Nb_{1/2})O_3$ - $Pb(Zn_{1/3}.Nb_{2/3})O_3$-$PbZrO_3$-$PbTiO_3$ in the relative proportions by mol % within the volume defined by a multi-faceted polyhedron enclosing the polygon areas of the ternary diagrams of FIGS. 2, 3, 4 and 5 as sections in numerical order, said compositions having an insulation resistance of at least $0.2 \times 10^4$ MΩ, an electro-mechanical coupling coefficient of at least 20% and a Poisson's ratio of at least one-third, said volume having the surface defined by a plurality of polygonal plane surface facets having apices corresponding to the numerals assigned thereto in FIGS. 2–5 as follows:

polygonal plane surfaces (32,48,49,43,36,21), (21,32,79,68), (32,48,87,79), (48,90,87), (48,49,90), (49,43,90), (43,36,83,90), (36,21,68,83), (68,79,113,104), (79,87,121,113), (87,90,123,121), (90,83,110,123), (83,68,104,110), (104,113,141,137), (113,121,148,141), (121,123,148), (123,143,148), (123,110,143), (110,104,137,143), and (137,141,148,143), where said numerals correspond to compositional values designated in mol % in accordance with the following table of relative proportions of compositions:

| | $Pb(Zn_{1/3}.Nb_{2/3})O_3$ | $Pb(Fe_{1/2}.Nb_{1/2})O_3$ | $PbZrO_3$ | $PbTiO_3$ |
|---|---|---|---|---|
| 21 | 10 | 10 | 50 | 30 |
| 32 | 10 | 10 | 30 | 50 |
| 36 | 10 | 50 | 30 | 10 |
| 43 | 10 | 60 | 20 | 10 |
| 48 | 10 | 50 | 10 | 30 |
| 49 | 10 | 60 | 10 | 20 |
| 68 | 20 | 10 | 40 | 30 |
| 79 | 20 | 10 | 20 | 50 |
| 83 | 20 | 50 | 20 | 10 |
| 87 | 20 | 30 | 10 | 40 |
| 90 | 20 | 60 | 10 | 10 |
| 104 | 30 | 10 | 40 | 20 |
| 110 | 30 | 30 | 30 | 10 |
| 113 | 30 | 10 | 20 | 40 |
| 121 | 30 | 30 | 10 | 30 |
| 123 | 30 | 50 | 10 | 10 |
| 137 | 40 | 10 | 30 | 20 |
| 141 | 40 | 10 | 20 | 30 |
| 143 | 40 | 30 | 20 | 10 |
| 148 | 40 | 30 | 10 | 20 |

* * * * *

UNITED STATES PATENT AND TRADEMARK OFFICE
CERTIFICATE OF CORRECTION

PATENT NO. : 4,024,081
DATED : May 17, 1977
INVENTOR(S) : Yasuo Ohmori; Mitsuo Sakakura; and Hajime Miyajima It is certified that error appears in the above-identified patent and that said Letters Patent are hereby corrected as shown below:

Col. 4, line 39, before "Table 1", insert the following:

---where fr(25°C), fr(-20°C) and fr(80°C) represent resonant frequencies at 25°C, -(minus) 20°C and 80°C, respectively.---

Col. 5, Table 1, Sample number 39, under Column "Kp(%)", "21.2" should be ---21.1---.

Col. 7, Table 1, Sample number 144, under Column "Firing temp. °C", "140" should be ---1240---.

Col. 8, Sample number 148, under Column "IR(X $10^4$MΩ)", "1.8" should be ---2.8---.

UNITED STATES PATENT AND TRADEMARK OFFICE
CERTIFICATE OF CORRECTION

PATENT NO. : 4,024,081　　　　　　　　　　Page 2 of 2
DATED : May 17, 1977
INVENTOR(S) : Yasuo Ohmori; Mitsuo Sakakura; and Hajime Miyajima It is certified that error appears in the above-identified patent and that said Letters Patent are hereby corrected as shown below:

Col. 9, line 56, insert ---126--- between "118" and "132".

Col. 9, lines 65-66, change "hydrogen" to ---hydroxide---.

Col. 12, claim 1, line 20, in the table, "$Pb(Fe_{\frac{1}{2}} \cdot Nb_{\frac{1}{2}}O_3$" should be ---$Pb(Fe_{\frac{1}{2}} \cdot Nb_{\frac{1}{2}})O_3$---.

Signed and Sealed this

Fifth Day of December 1978

[SEAL]

Attest:

RUTH C. MASON
Attesting Officer

DONALD W. BANNER
Commissioner of Patents and Trademarks